(12) United States Patent
Tosoni et al.

(10) Patent No.: US 11,716,005 B2
(45) Date of Patent: Aug. 1, 2023

(54) ELECTROMAGNETIC ENERGY CONVERTER

(71) Applicant: COMMISSARIAT A L'ENERGIE ATOMIQUE ET AUX ENERGIES ALTERNATIVES, Paris (FR)

(72) Inventors: Olivier Tosoni, Grenoble (FR); Gerard Delette, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 65 days.

(21) Appl. No.: 16/628,817

(22) PCT Filed: Jul. 9, 2018

(86) PCT No.: PCT/FR2018/051719
§ 371 (c)(1),
(2) Date: Jan. 6, 2020

(87) PCT Pub. No.: WO2019/012213
PCT Pub. Date: Jan. 17, 2019

(65) Prior Publication Data
US 2020/0227994 A1 Jul. 16, 2020

(30) Foreign Application Priority Data
Jul. 11, 2017 (FR) .................................... 17 56582

(51) Int. Cl.
*H02K 35/02* (2006.01)
*H03K 17/97* (2006.01)

(52) U.S. Cl.
CPC ............ *H02K 35/02* (2013.01); *H03K 17/97* (2013.01); *H03K 2017/9706* (2013.01)

(58) Field of Classification Search
CPC . H02K 35/02; H03K 17/97; H03K 2017/9706
See application file for complete search history.

(56) References Cited

U.S. PATENT DOCUMENTS

| 4,471,353 A | 9/1984 | Cernik |
| 4,500,827 A * | 2/1985 | Merritt .................. H02K 35/02 322/3 |

(Continued)

FOREIGN PATENT DOCUMENTS

| CN | 204408156 U | 6/2015 |
| DE | 198 52 470 A1 | 5/2000 |
| WO | WO 2009/119450 A1 | 10/2009 |

OTHER PUBLICATIONS

International Search Report dated Sep. 17, 2018 in PCT/FR2018/051719 filed on Jul. 9, 2018, 3 pages.

(Continued)

*Primary Examiner* — Bernard Rojas
(74) *Attorney, Agent, or Firm* — Oblon, McClelland, Maier & Neustadt, L.L.P.

(57) ABSTRACT

A converter includes a coil of axis XX', a multi-pole magnet, arranged in such a way that the magnetic polarities of two adjacent magnetised zones are oriented so that they are anti-parallel, a ferromagnetic field frame comprising a frame and a main section, the field frame further comprising a main air gap located on the main section, and a first lateral air gap and a second lateral air gap which are located on the frame, the main air gap, the first lateral air gap and the second lateral air gap being arranged in such a way as to form a guide member in which the multi-pole magnet is inserted by sliding, and in such a way as to allow a magnetic coupling of three successive magnetised zones with, respectively, the first lateral air gap, the main air gap, and the second lateral air gap.

11 Claims, 2 Drawing Sheets

(56) References Cited

U.S. PATENT DOCUMENTS

| | | | |
|---|---|---|---|
| 4,924,123 A * | 5/1990 | Hamajima | H02K 35/02 |
| | | | 310/15 |
| 5,671,526 A * | 9/1997 | Merlano | H01F 41/0233 |
| | | | 29/609 |
| 9,240,267 B2 | 1/2016 | Nagahara et al. | |
| 9,509,304 B2 | 11/2016 | Ruff | |
| 2016/0365759 A1* | 12/2016 | Lin | H02K 53/00 |
| 2018/0198336 A1* | 7/2018 | Abella | H02K 53/00 |
| 2019/0348896 A1* | 11/2019 | Delette | H02K 35/02 |
| 2020/0248747 A1* | 8/2020 | Peijnenburg | G03F 7/70716 |
| 2021/0272736 A1* | 9/2021 | Ashizawa | H01F 3/14 |

OTHER PUBLICATIONS

French Preliminary Search Report dated Mar. 26, 2018 in French Application 1756582 filed on Jul. 11, 2017.

\* cited by examiner

ELECTROMAGNETIC ENERGY CONVERTER

TECHNICAL FIELD

The present invention relates to an electromagnetic energy converter. In particular, the present invention relates to an electromagnetic energy converter intended to be implemented in a self-contained switch.

PRIOR ART

An electromagnetic energy converter, known in the prior art, comprises:
- a ferromagnetic yoke;
- a conductive coil formed by the winding of a conducting wire about a section of the ferromagnetic yoke;
- a main magnet, offset from the coil, forming with the yoke a closed magnetic circuit.

According to this configuration, a magnetic flux generated by the main magnet and guided by the ferromagnetic yoke passes through the conductive coil.

The general operating principle of the electromagnetic energy converter is based on the activation of a time variation of the magnetic flux passing through the conductive coil so as to induce an electrical voltage at the terminals of the latter.

In this regard, the electromagnetic energy converter is also equipped with a mechanical activation system, the action whereof makes it possible to activate the time variation of the magnetic flux. In particular, the time variation of the magnetic flux can be the result of a displacement of the main magnet or of the conductive coil, as described in documents [1] and [2] cited at the end of the description.

However, these electromagnetic energy converters described in documents [1] and [2] are not entirely satisfactory.

More specifically, the magnetic flux passing through the conductive coil is limited by the magnetic losses and the magnetic saturation of the ferromagnetic yoke, consequently restricting the magnetic flux variation useful in the generation of the electrical voltage at the terminals of the conductive coil.

Moreover, the mechanical activation system requires the use of an energy release and/or storage module, such as spring leaves or ratchets, allowing rapid movement of the conductive coil or of the main magnet such that a significant voltage can be reached at the terminals of the conductive coil.

For the purposes of illustration, a displacement of a duration in the order of one millisecond is necessary for a converter, having a volume in the order of 1 cm$^3$, to generate an electrical voltage in the order of one Volt at the terminals of the conductive coil. A voltage of this order of magnitude is in particular required when the electromagnetic energy converter is implemented in self-contained switches.

However, the energy release and/or storage module is generally in contact with the magnetic circuit thus generating reliability and wear problems.

One purpose of the present invention is thus to propose a compact electromagnetic energy converter that is capable of having a significant electrical voltage at the terminals of the conductive coil.

Another purpose of the present invention is also to propose an electromagnetic energy converter which is simpler to implement.

DESCRIPTION OF THE INVENTION

The above purposes are at least partially achieved by an electromagnetic energy converter comprising:
- at least one conductive coil of main axis XX',
- a single-piece multipole magnet comprising at least three magnetised zones of the same dimensions, aligned along an elongation axis YY' of the multipole magnet, said multi pole magnet being arranged in such a way that the magnetic polarities of two adjacent magnetised zones are essentially oriented so that they are anti-parallel in a direction perpendicular to the elongation axis YY',
- a ferromagnetic yoke comprising a frame and a main section arranged so as to form two magnetic loops respectively referred to as a first magnetic loop and a second magnetic loop, which are adjacent at the main section, the main section passes through the at least one conductive coil, the yoke further comprises a main air-gap disposed on the main section, and two lateral air-gaps, respectively referred to as a first lateral air-gap and a second lateral air-gap which are disposed on the frame, the main air-gap, the first lateral air-gap and the second lateral air-gap are arranged in such a way as to form a guide member into which the multipole magnet is inserted by sliding, and in such a way as to allow magnetic coupling of three successive magnetised zones with, respectively, the first lateral air-gap, the main air-gap, and the second lateral air-gap.

The term "to allow magnetic coupling of a magnetised zone with an air-gap" is understood herein to mean that said magnetised zone imposes the circulation of a magnetic flux from the air-gap in at least one of the two magnetic loops. In other words, the magnetised zone is at least partially housed inside the air-gap.

According to one embodiment, the multipole magnet comprises 4 magnetised zones.

According to one embodiment, each of the magnetised zones from the at least three magnetised zones comprises a permanent magnet, and advantageously the permanent magnets of each of the magnetised zones are identical.

According to one embodiment, the converter further comprises a return member intended to force the multipole magnet to adopt a first position of magnetic equilibrium when no external force is exerted on the multipole magnet, more particularly, the first position of equilibrium corresponding to a position of the multipole magnet for which three successive and predetermined magnetised zones of the multipole magnet, referred to as a first magnetised zone, a second magnetised zone and a third magnetised zone are magnetically coupled with, respectively, the first lateral air-gap, the main air-gap and the second lateral air-gap, more particularly, the third magnetised zone being disposed at one end of the multipole magnet.

According to one embodiment, the multipole magnet comprises 4 magnetised zones.

According to one embodiment, the at least one conductive coil comprises two conductive coils, respectively referred to as a first conductive coil and a second conductive coil, the first conductive coil and the second conductive coil each being disposed on either side of the main air-gap, around the central section of the ferromagnetic yoke.

According to one embodiment, the converter is symmetric relative to a plane perpendicular to the main axis XX'.

According to one embodiment, the frame is a rectangular frame which comprises a first lateral section and a second lateral section parallel to the main section and at which the first lateral air-gap and the second lateral air-gap are respectively disposed.

According to one embodiment, the gaps of the first lateral air-gap, the second lateral air-gap and the main air-gap are equal.

The invention further relates to a switch comprising a converter according to the present invention.

BRIEF DESCRIPTION OF THE FIGURES

Other features and advantages will be better understood after reading the following description of the electromagnetic energy converter according to the invention, provided as non-limiting examples only, with reference to the accompanying drawings in which.

DETAILED DESCRIPTION OF SPECIFIC EMBODIMENTS

FIG. 1a, 1b, 2a and 2b show two example embodiments of an electromagnetic energy converter 100 according to the present invention.

The electromagnetic energy converter 100 comprises a multipole magnet 200.

The multipole magnet 200 is a one-piece cast (FIGS. 1a and 2b) and comprises at least three magnetised zones 210a, 210b, 210c of the same dimensions and aligned along an elongation axis YY' of the multipole magnet. In particular, the magnetic polarities of two adjacent magnetised zones are oriented so that they are essentially anti-parallel in a direction perpendicular to the elongation axis YY'.

The term "magnetic polarisation" is understood herein to mean the orientation of the poles of the magnet and the direction of the magnetic field created by said magnet.

In other words, the magnetic polarisations of the at least three magnetised zones are alternately oriented in opposite directions (the magnetic polarisations are symbolised by arrows at the magnetised zones in FIG. 1a to 2b).

It is understood that if the magnetised zones 210a, 210b and 210c have the same dimensions, the arrangement of said magnetised zones, forming the multipole magnet 200, is periodic with a pitch P along the elongation axis YY' of said multipole magnet.

It goes without saying that the multipole magnet 200 is understood to be straight in the direction defined by the elongation axis YY' thereof. In particular, the multipole magnet 200 is a bar, the shape whereof is, for example, parallelepipedal.

The magnetised zones 210a, 210b, 210c and 201d can be parallelepipedal in shape.

In the rest of the description herein, a multipole magnet 200 comprising 4 magnetised zones 210a, 210b, 210c and 210d will be considered. The reasonings made in this context can however be transposed to any multipole magnet 200 comprising at least 3 magnetised zones.

The multipole magnet 200 can comprise an assembly of permanent magnets, the dimension whereof in the direction of elongation of the multipole magnet 200 is equal to the pitch P.

The permanent magnets are advantageously bonded, or crimped on a medium made of a non-magnetic material, for example a plastics material.

The permanent magnets can comprise at least one of the elements selected from the group consisting of: NdFeB magnets, SmCo magnets, or ferrite magnets.

In particular, the permanent magnets can be sintered or linked anisotropically or otherwise.

However, the invention is not limited to a multipole magnet 200 formed by an assembly of permanent magnets, and can have a magnetic profile (continuous or otherwise) that is periodic and that has maximum and minimum magnetisations of opposite symbols.

Figure 1A:
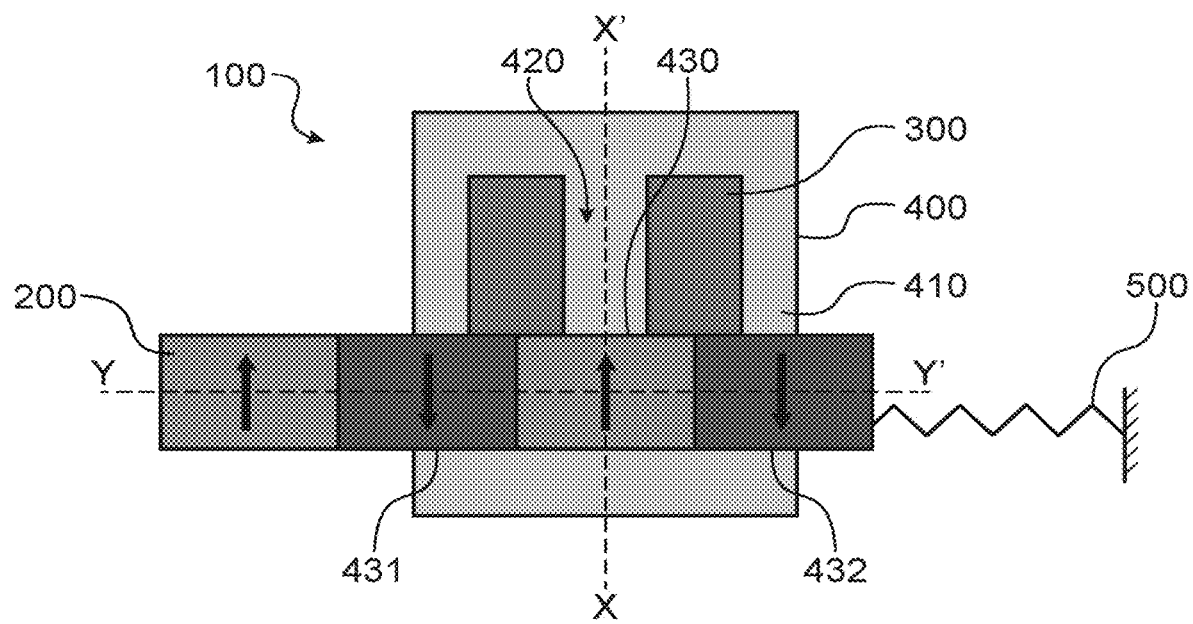
FIGS. 1a and 1b are diagrammatic views, along a cutting plane comprising the axes XX' and YY', of an electromagnetic energy converter provided with a single conductive coil according to the present invention.
Figure 1B:
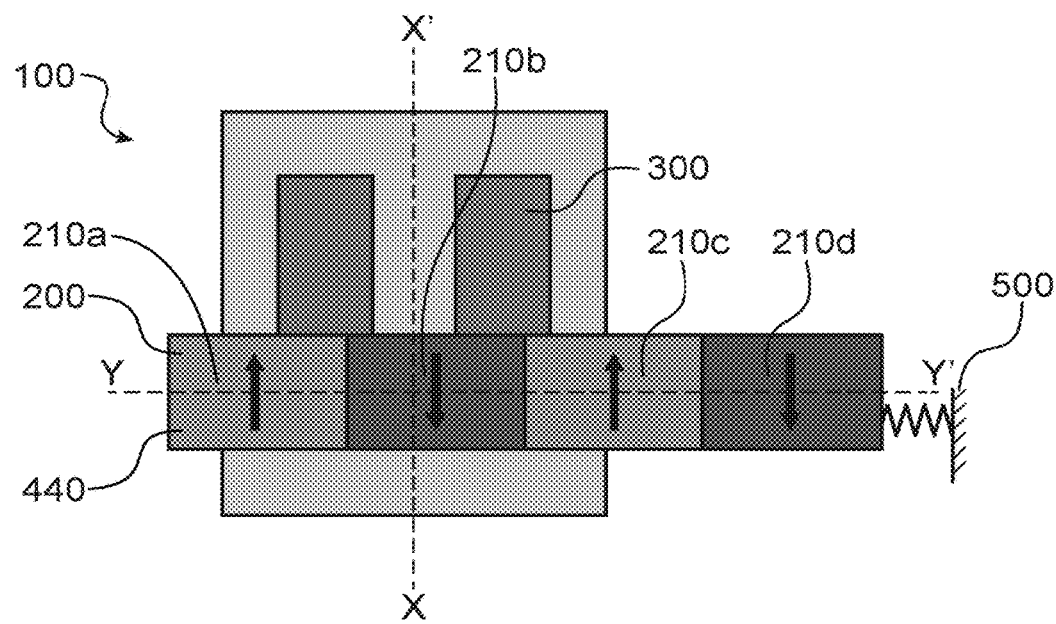

The electromagnetic energy converter 100 comprises at least one conductive coil 300 which extends along a main axis XX' and comprises two ends, respectively referred to as a first end and a second end (FIGS. 1a and 1b). The term "main axis XX'" is understood herein to mean an axis of symmetry of the at least one conductive coil 300.

The at least one conductive coil 300 is formed by a winding of a conducting wire, for example a copper wire, along the main axis XX'. The conductive coil 300 further comprises an internal volume V open at the two ends of said coil. It goes without saying that the conducting wire comprises two ends which are, throughout the remainder of the present description, referred to as terminals of the conductive coil 300.

The electromagnetic energy converter 100 further comprises a ferromagnetic yoke 400.

The ferromagnetic yoke 400 comprises a frame 410 and a main section 420.

The ferromagnetic yoke can comprise at least one ferromagnetic material selected from the group consisting of: iron-based alloys with high saturation induction (for example a saturation induction greater than 1.5 Tesla) such as pure iron, Si-alloyed iron (FeSi), Ni-alloyed iron (FeNi), or Co-alloyed iron (FeCo). These alloys can further comprise alloy additions such as Cr, P, Cu, or Al.

The ferromagnetic material can further comprise at least one of the elements selected from the group consisting of: a spinel structure ferrite (such as MnZn, or NiZn). The latter, due to the low electrical conductivity thereof, are particularly advantageous because they allow the eddy current loss to be reduced.

Finally, the ferromagnetic material can further comprise at least one of the elements selected from the group consisting of: an iron-based alloy of the metallic glass type produced in amorphous or nanocrystalline form.

These materials can be solid or, more advantageously, in the form of stacked sheets separated by thin insulating films (with the exception of soft ferrite materials) in order to limit the induced currents and associated losses.

As per the present invention, the frame 410 is not necessarily a one-piece cast.

The frame 410 and the main section 420 are arranged so as to form two magnetic loops, respectively referred to as a first magnetic loop and a second magnetic loop, that are adjacent at the main section 420. In other words, the frame 410 and the main section 420 are arranged so as to guide a magnetic flux according to two magnetic loops.

The area of the cross-section of the main section 420 can be double the area of the cross-section of the frame 410.

The term "adjacent at the main section" is understood herein to mean that the two magnetic loops pass through the main section 420.

The main section 420 passes through the at least one conductive coil 300 along the main axis XX' such that any magnetic flux guided by either or both of the two magnetic loops also passes through the at least one conductive coil 300.

It is also understood that, as per the present invention, the term "section" designates a straight element (for example a bar, or a rod) extending along an elongation axis. This definition does not limit, in any way, the shape of the cross-section thereof (the cross-section designating a cutting plane of the section along a plane perpendicular to the elongation axis of said section).

Figure 2A:
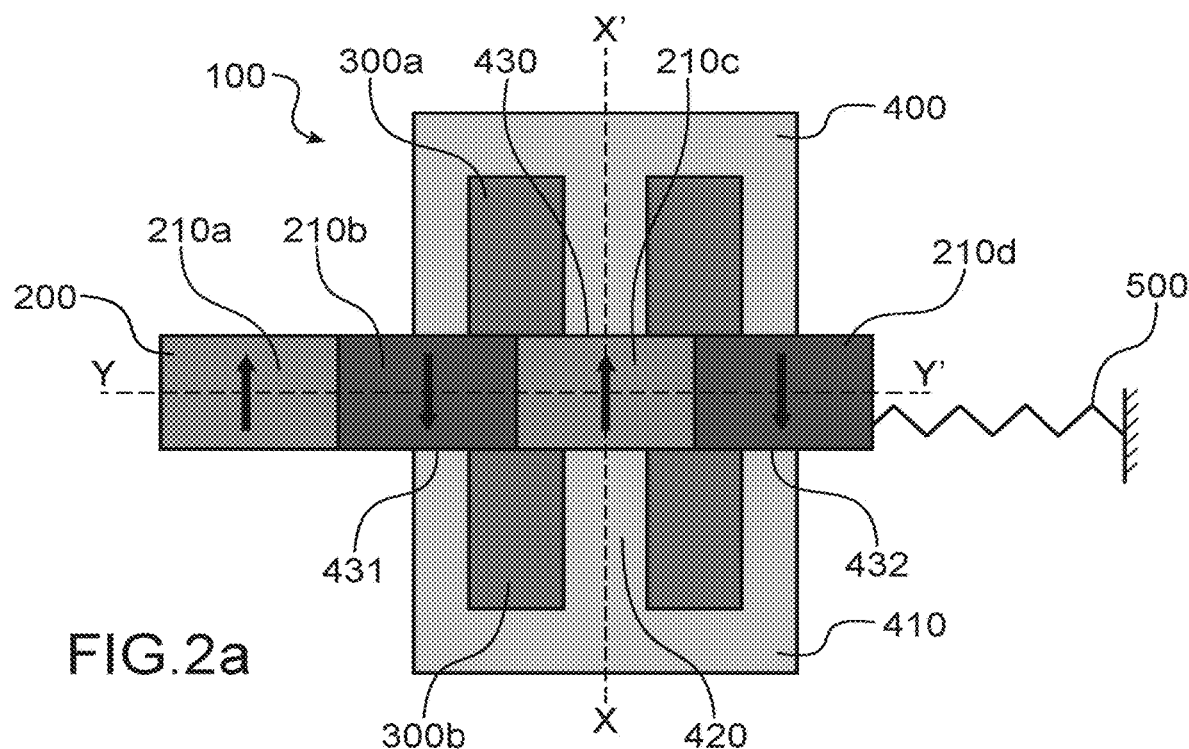
FIGS. 2a and 2b are diagrammatic views, along a cutting plane comprising the axes XX' and YY', of an electromagnetic energy converter provided with two conductive coils according to the present invention.

The ferromagnetic yoke 400 comprises a main air-gap 430 and two lateral air-gaps, respectively referred to as a first lateral air-gap 431 and a second lateral air-gap 432 (FIGS. 1a and 2a).

The main air-gap 430 is disposed at the main section 420.

The first lateral air-gap 431 and the second lateral air-gap 432 are disposed on the frame 410.

Figure 2B:
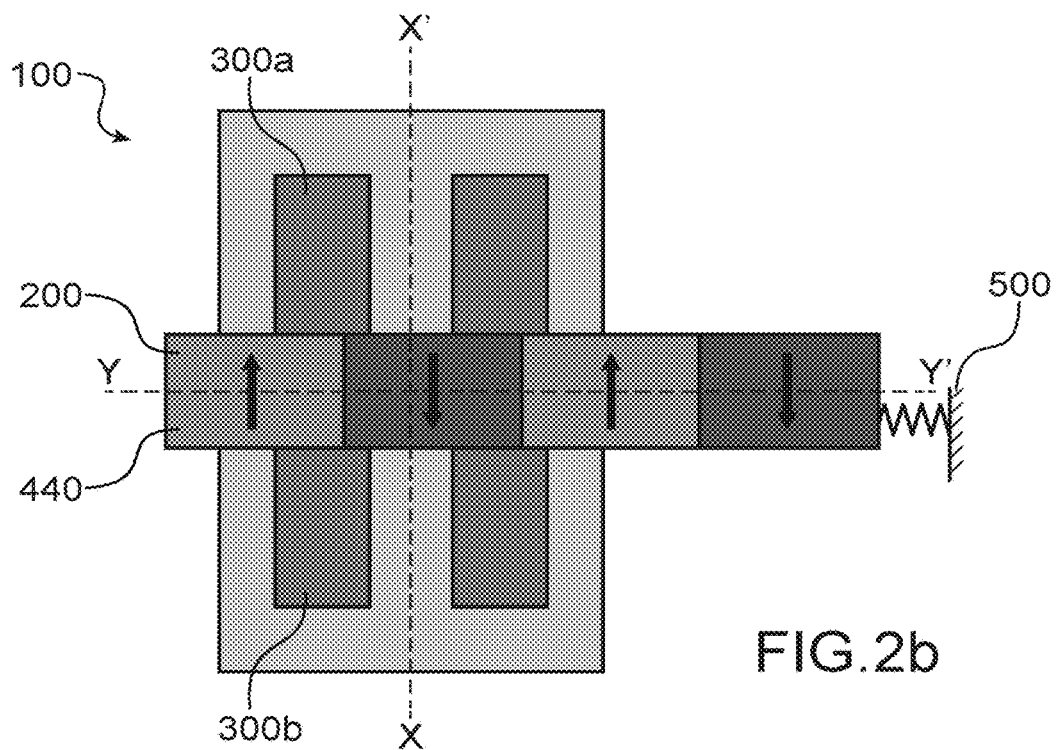

The main air-gap 430, the first lateral air-gap 431 and the second lateral air-gap 432 are arranged such that they form a guide member 440 into which the multipole magnet 200 is inserted by sliding (FIGS. 1b and 2b).

The term "inserted by sliding" is understood herein to mean that the multipole magnet 200 can slide, for example, under the action of an external force.

In particular, since the multipole magnet 200 is rectilinear, it is understood that the main air-gap 430, the first lateral air-gap 431 and the second lateral air-gap 432 are aligned along the elongation axis YY' of the multipole magnet 200.

It goes without saying that the first air-gap 431 and the second air-gap 432 are also understood to be disposed, respectively, on the first magnetic loop and on the second magnetic loop.

Moreover, the main air-gap 430, the first lateral air-gap 431 and the second lateral air-gap 432 are arranged so as to allow for simultaneous magnetic coupling of three successive magnetised zones with, respectively, the first lateral air-gap, the main air-gap, and the second lateral air-gap.

The term "to allow magnetic coupling of a magnetised zone with an air-gap" is understood herein to mean that said magnetised zone imposes the circulation of a magnetic flux from the air-gap in at least one of the two magnetic loops. In other words, the magnetised zone is at least partially housed inside the air-gap.

In particular, the main air-gap 430, the first lateral air-gap 431 and the second lateral air-gap 432 can be arranged so as to allow for centring along the elongation axis YY' of three successive magnetised zones in, respectively, the first lateral air-gap 431, the main air-gap 430, and the second lateral air-gap 432.

It is thus understood that the main air-gap is equally spaced from the first and second lateral air-gaps.

In particular, a magnetised zone coupled with the first lateral air-gap 431 imposes the circulation of a magnetic flux along the first magnetic loop, and in a direction determined by the orientation of the magnetic polarisation of said magnetised zone.

In an equivalent manner, a magnetised zone coupled with the second lateral air-gap imposes the circulation of a magnetic flux along the second magnetic loop, and in a direction determined by the orientation of the magnetic polarisation of said magnetised zone.

Finally, a magnetised zone coupled with the main air-gap imposes the circulation of a magnetic flux along the first and the second magnetic loop, and in a direction determined by the orientation of the magnetic polarisation of said magnetised zone.

Thus, the periodic arrangement of the multipole magnet 200 allows the magnetic fluxes of the three magnetised zones to be added together and converge in the main section 420 so as to pass through the at least one conductive coil 300.

Moreover, when successive magnetised zones of the multipole magnet 200 are magnetically coupled to air-gaps of the ferromagnetic yoke 400 (for example 3 magnetised zones are coupled, respectively, to the three air-gaps), the electromagnetic energy converter 100 is in a stable state of magnetic equilibrium.

When in a stable state of magnetic equilibrium, the multipole magnet 200 provides resistance to any sliding along the elongation axis YY'.

However, when the sliding of the multipole magnet 200 along the elongation axis YY', under the action of an external force, exceeds half a pitch P from an initial stable position of equilibrium, said multipole magnet undergoes an attractive magnetic force forcing it to adopt a new stable position of equilibrium.

This new stable position of equilibrium corresponds to a translation by a pitch P of the multipole magnet 200 relative to the initial stable position of equilibrium.

In particular, depending on the direction of the force exerted on the multipole magnet 200, when the latter comprises four magnetised zones, the new stable position of equilibrium corresponds to the coupling of three air-gap zones with three magnetised zones.

During the sliding of the multipole magnet 200 under the action of the external force, the transition thereof from the initial stable position of equilibrium to the new stable position of equilibrium generates a variation in the magnetic flux (in particular an inversion of the magnetic flux) passing through the at least one conductive coil 300. This magnetic flux variation results in the appearance of an electrical voltage at the terminals of the at least one conductive coil 300. Moreover, it should be noted that the attractive magnetic force exerted on the multipole magnet 200 during the sliding thereof accelerates the movement, and thus facilitates a rapid variation in the magnetic flux passing through the at least one conductive coil 300. By way of example, a multipole magnet having a mass in the order of 1 gram can slide between two stable positions of magnetic equilibrium in a few milliseconds. This rapid transition facilitates the generation of a substantial electrical voltage, for example in the order of one volt, at the terminals of the conductive coil 300.

Advantageously, the electromagnetic energy converter 100 can comprise a return member 500 intended to force the multipole magnet to adopt a first stable position of magnetic equilibrium P1 when no external force is exerted on the multipole magnet.

The first stable position of magnetic equilibrium P1 (FIGS. 1a and 2a) can thus correspond to a position of the multipole magnet 200 for which three successive and predetermined magnetised zones, referred to as a first magnetised zone, a second magnetised zone and a third magnetised zone are magnetically coupled with, respectively, the first lateral air-gap 431, the main air-gap 430, and the second lateral air-gap 432.

According to this arrangement, for which four magnetised zones and one return member 500 are considered, a force exerted on the multipole magnet would result in the sliding thereof from the first stable position of magnetic equilibrium P1 to another position of magnetic equilibrium (this sliding is also referred to as a "direct cycle"), whereas the return member 500, after the force is released, will bring the multipole magnet back to the first stable position of magnetic equilibrium P1 thereof (this reverse sliding is also referred to as an "indirect cycle"). This so-called back-and-forth sliding of the multipole magnet 200 allows the variation in the magnetic flux passing through the at least one conductive coil 300 to be increased.

Thus, according to the present invention, the multipole magnet 200 is guided by the air-gaps, allowing a compact electromagnetic energy converter to be considered.

Moreover, simple sliding of the multipole magnet allows a flux inversion to take place at each of the air-gaps for a displacement of "one pitch P" along the elongation axis of said multipole magnet.

Furthermore, the bi-stability of the electromagnetic energy converter 100 as per the present invention completely does away with the need for an energy release and/or storage module.

In a particularly advantageous manner, the multipole magnet can comprise 5 magnetised zones. The increase in the number of magnetised zones allows a plurality of inversions to be obtained for the magnetic flux passing through the at least one conductive coil 300.

The at least one conductive coil 300 can comprise two conductive coils, respectively referred to as a first conductive coil 300a and a second conductive coil 300b (FIGS. 2a and 2b).

In particular, the first conductive coil 300a and the second conductive coil 300b are each disposed on either side of the main air-gap 430.

The electromagnetic energy converter 100 can further be symmetric relative to a plane perpendicular to the main axis XX'.

Advantageously, the frame 410 can be a rectangular frame which comprises a first lateral section and a second lateral section parallel to the main section and at which the first lateral air-gap 431 and the second lateral air-gap 432 are respectively disposed.

The ferromagnetic yoke can advantageously be an assembly of two "E"-shaped ferromagnet "subclasses".

Moreover, the gaps of the first lateral air-gap 431, the second lateral air-gap 432 and the main air-gap 430 can be equal.

In particular, the main axis of the main section is at a distance P from each of the main axes of the first and second lateral sections.

The multipole magnet 200 can be produced by juxtaposing a plurality of single-axis permanent magnets and by respecting an alternation of the polarity thereof. The permanent magnets can be bonded to one another, or crimped on a medium made of a non-magnetic and low-conducting material, for example plastic. Permanent magnets can advantageously be sintered magnets. Such magnets have the advantage of having high remanence, and thus of generating a higher magnetic flux per unit of volume.

Alternatively, the multipole magnet can be formed by plastic injection moulding of a hot mixture in the cavity of a mould. For example, the injected hot mixture can comprise one or more polymers and a magnetic powder (for example a SmCo or NdFeB powder having undergone appropriate treatment). A magnetic field is generated within the cavity of the mould by a specific magnetic system housed inside the injection mould. This field has the N-S/S-N alternation according to the target periodicity for the multipole magnet.

When the magnetic powder particles reach the die, they have time to be oriented and magnetised by following this field before the polymer is fixed by cooling. Once locked by the cold polymer, the magnetic particles retain the magnetisation imparted by the mould and reproduce the desired periodic magnetic profile.

The present invention further relates to a switch, for example a self-contained switch comprising the electromagnetic energy converter according to the present invention.

The implementation of an electromagnetic energy converter according to the present invention allows small-size and more robust self-contained switches to be produced compared to the known switches of the prior art.

The electromagnetic energy converter can also be implemented in controls, travel limit sensors, opening detectors, and other mechanically-actuated self-contained detectors.

In most cases, the energy recovered will be partially used to transmit radio information to a remote wireless receiver, which information provides, for example, the state of the switches/sensors/detectors. However, other applications can be considered, such as, for example, event counting, with recording in a memory and which does not necessarily generate communication for each mechanical press.

REFERENCES

[1] U.S. Pat. No. 9,240,267,
[2] U.S. Pat. No. 9,509,304.

The invention claimed is:
1. An electromagnetic energy converter comprising:
at least one conductive coil having a main axis,
a single-piece multipole magnet comprising at least three magnetised zones of the same dimensions aligned along an elongation axis of the multipole magnet, said multipole magnet being arranged in such a way that each of the magnetised zones is contiguous with at least one other of the magnetised zones and the magnetic polarities of two adjacent magnetised zones are essentially oriented so that they are anti-parallel in a direction perpendicular to the elongation axis, and
a ferromagnetic yoke comprising a frame and a main section arranged so as to form two magnetic loops respectively referred to as a first magnetic loop and a second magnetic loop, which are adjacent at the main section, wherein
the at least one conductive coil is wound around the main section such that the main section passes through the at least one conductive coil along the main axis,
the yoke further comprises a main air-gap disposed on the main section, and two lateral air-gaps, respectively referred to as a first lateral air-gap and a second lateral air-gap which are disposed on the frame,
the main air-gap, the first lateral air-gap, and the second lateral air-gap each are defined by opposing surfaces of the yoke,
the main air-gap, the first lateral air-gap, and the second lateral air-gap are arranged in such a way as to form a guide member into which the multipole magnet is inserted by sliding, and in such a way as to allow magnetic coupling of three successive magnetised zones with, respectively, the first lateral air-gap, the main air-gap, and the second lateral air-gap,
an area of a cross section of the main section is larger than an area of a cross section of the frame, and
a length each of the magnetized zones from distal ends thereof and along the elongation axis is greater than a length parallel to the elongation axis from the main section to the frame and spanning a portion of the at least one conductive coil therebetween.

2. The electromagnetic energy converter according to claim 1, wherein each of the magnetised zones from the at least three magnetised zones comprises a permanent magnet.

3. The converter according to claim 1, wherein
the converter further comprises a return member intended to force the multipole magnet to adopt a first stable position of magnetic equilibrium when no external force is exerted on the multipole magnet,
the first stable position of magnetic equilibrium corresponds to a position of the multipole magnet for which three successive and predetermined magnetised zones, referred to as a first magnetised zone, a second magnetised zone, and a third magnetised zone are magnetically coupled with, respectively, the first lateral air-gap, the main air-gap, and the second lateral air-gap, and
the third magnetised zone is disposed at one end of the multipole magnet.

4. The electromagnetic energy converter according to claim 1, wherein the multipole magnet comprises 4 or 5 magnetised zones.

5. The electromagnetic energy converter according to claim 1, wherein the at least one conductive coil comprises two conductive coils, respectively referred to as a first conductive coil and a second conductive coil, the first conductive coil and the second conductive coil each being disposed entirely on either side of the main air-gap.

6. The electromagnetic energy converter according to claim 5, wherein the converter is symmetric relative to a plane perpendicular to the main axis.

7. The electromagnetic energy converter according to claim 1, wherein the frame is a rectangular frame which comprises a first lateral section and a second lateral section parallel to the main section and at which the first lateral air-gap and the second lateral air-gap are respectively disposed.

8. The electromagnetic energy converter according to claim 1, wherein the gaps of the first lateral air-gap, the second lateral air-gap, and the main air-gap are equal.

9. The electromagnetic energy converter according to claim 1, wherein the electromagnetic converter forms part of a switch.

10. The electromagnetic energy converter according to claim 2, wherein the converter further comprises a return member intended to force the multipole magnet to adopt a first stable position of magnetic equilibrium when no external force is exerted on the multipole magnet,
the first stable position of magnetic equilibrium corresponds to a position of the multipole magnet for which three successive and predetermined magnetised zones, referred to as a first magnetised zone, a second magnetised zone and a third magnetised zone are magnetically coupled with, respectively, the first lateral air-gap, the main air-gap and the second lateral air-gap, and
the third magnetised zone is disposed at one end of the multipole magnet.

11. The electromagnetic energy converter according to claim 1, wherein the area of the cross section of the main section is double the area of the cross section of the frame.

* * * * *